United States Patent [19]
Turlik et al.

[11] Patent Number: 5,325,265
[45] Date of Patent: Jun. 28, 1994

[54] HIGH PERFORMANCE INTEGRATED CIRCUIT CHIP PACKAGE

[75] Inventors: Iwona Turlik; Arnold Reisman, both of Raleigh, N.C.; Deepak Nayak, Los Angeles, Calif.; Lih-Tyng Hwang, Durham, N.C.; Giora Dishon, Jerusalem, Israel; Scott L. Jacobs, Apex, N.C.; Robert F. Darveaux, Raleigh, N.C.; Neil M. Poley, Cary, N.C.

[73] Assignees: MCNC, Research Triangle Park, N.C.; IBM Corporation, Armonk, N.Y.; Northern Telecom Limited, Montreal, Canada

[21] Appl. No.: 819,571

[22] Filed: Jan. 7, 1992

Related U.S. Application Data

[63] Continuation of Ser. No. 270,729, Nov. 10, 1988, abandoned.

[51] Int. Cl.[5] .............................................. H05K 7/20
[52] U.S. Cl. ..................................... 361/702; 361/711; 361/712; 257/714
[58] Field of Search ....................... 357/71, 74, 75, 80, 357/79, 81–82; 361/382, 385–389, 412, 414

[56] References Cited

U.S. PATENT DOCUMENTS

| | | |
|---|---|---|
| 4,092,697 | 5/1978 | Spaight . |
| 4,141,135 | 2/1979 | Henry et al. . |
| 4,156,458 | 5/1979 | Chu et al. . |
| 4,161,701 | 7/1979 | Takeda et al. . |
| 4,180,414 | 12/1979 | Diamond et al. . |
| 4,295,183 | 10/1981 | Mierach et al. . |
| 4,322,778 | 3/1982 | Barbour et al. . |
| 4,349,862 | 9/1982 | Bajorek et al. . |
| 4,498,530 | 2/1985 | Lipschutz . |
| 4,612,601 | 9/1986 | Watari . |
| 4,617,730 | 10/1986 | Geldermans et al. . |
| 4,639,829 | 1/1987 | Ostergren et al. . |
| 4,652,977 | 3/1987 | Jones ................... 361/414 |
| 4,698,663 | 10/1987 | Sugimoto et al. ............ 361/386 |
| 4,717,591 | 1/1988 | Acosta et al. . |
| 4,729,060 | 3/1988 | Yamamoto et al. ............. 361/385 |
| 4,740,866 | 4/1988 | Kajiwara et al. ................ 357/82 |
| 4,758,926 | 7/1988 | Herrell et al. . |
| 4,926,241 | 5/1990 | Carey ....................... 357/75 |
| 4,942,076 | 7/1990 | Panicker et al. ................ 428/137 |

FOREIGN PATENT DOCUMENTS

| | | |
|---|---|---|
| 55-95352 | 7/1980 | Japan . |
| 59-213151 | 12/1984 | Japan . |
| 61-18159 | 1/1986 | Japan . |
| 61-97953 | 5/1986 | Japan . |
| 63-289847 | 11/1988 | Japan . |

OTHER PUBLICATIONS

Dombrowskas et al, "Conduction Cooled Chip Module", IBM Tech Dis Bulletin, vol. 14, No. 9, Feb. 1972, p. 2689.

Johnson et al "Chip Heat Sink Package Assembly" IBM Tech Dis Bulletin, vol. 12, No. 3/70, p. 1665.

Arnold et al "Thermally Enhanced Module for Self-Contained Data Processing Package", vol. 20, No. 5, pp. 1766–1767.

(List continued on next page.)

*Primary Examiner*—Gregory D. Thompson
*Attorney, Agent, or Firm*—Bell, Seltzer, Park & Gibson

[57] ABSTRACT

A high performance integrated circuit chip package includes a support substrate having conductors extending from one face to the opposite face thereof and a multilayer wiring substrate on the opposite face of the support substrate for connecting chips mounted thereon to one another and to the conductors. A heat sink includes microchannels at one face thereof, with thermally conductive cushions connecting the one face of the heat sink with the exposed back sides of the chips, to provide a high density chip package with high heat dissipation. The support substrate and heat sink may be formed of blocks of material having thermal expansion matching silicon. The cushions are a low melting point solder, preferably pure indium, and are sufficiently thick to absorb thermal stresses, but sufficiently thin to efficiently conduct heat from the chips to the heat sink.

29 Claims, 5 Drawing Sheets

OTHER PUBLICATIONS

IBM Tech Disc Bulletin vol. 31, No. 11, Apr. 1989, pp. 40–42, "Monlithic Ceramic Substrate And Heat Sink for Integrated Circuit Packages".

*Thermal Management Air-and Liquid-Cooled Multichip Modules,* A. Bar-Cohen, IEEE Transactions on Components, Hybrids, and Manufacturing Technology, vol. CHMT-9, No. 4, Dec. 1986, pp. 328-335.

*High-Thermal Conduction Module,* M. Kohara et al., 35th Electronic Components Conference, May 1985, Washington, DC, pp. 180-186.

*Thermal Analysis of a Multi-Chip Package Design,* R. Darveau et al., Journal of Electronic Materials, vol. 18, No. 2, 1989, pp. 267-274.

European Search Report dated Sep. 5, 1991.

Chip Heat Sink Package Assembly by A. H. Johnson, J. E. Martyak and M. V. Vilkelis-IBM Technical Disclosure Bulletin, vol. 12, No. 10 Mar., 1970.

High-Performance Heat Sinking for VLSI by D. B. Tuckerman and R. F. Pease IEEE Electron Device Letters, vol. EDL-2, No. 5-May, 1981.

High-Performance Computer Packaging and the Thin-Film Multichip Module by C. W. Ho-VLSI Electronics Microstructure Science, vol. 5-1982.

Thermal Conduction Module: A High-Performance Multilayer Ceramic Package by A. J. Blodgett and D. R. Barbour-IBM J. Research Development, vol. 26, No. 1-Jan. 1982.

A. Conduction-Cooled Module For High-Performance LSI Devices by S. Oktay and H. C. Kammerer-IBM J. Res. Development, vol. 26, No. 1 Jan., 1982.

Ultrahigh Thermal Conductance Microstructures For Cooling Integrated Circuits by D. B. Tuckerman and R. F. Pease-Stanford Electronics Laboratories-IEEE 1982.

Multi-Layer Ceramics Manufacturing by W. G. Burger and C. W. Weigel IBM J. Research Development, vol. 27, No. 1-Jan., 1983.

Microcapillary Thermal Interface Technology for VLSI Packaging by D. B. Tuckerman and R. F. Pease-Stanford Electronics Laboratories Symposium on VLSI Technology-1983.

Silicon-on-Silicon Packaging by R. K. Spielberger, C. D. Huang, W. H. Nunne, A. H. Mones, D. L. Fett and F. L. Hampton-IEEE Transactions on Components, Hybrids and Manufacturing Technology, vol. CHMT-7, No. 2, Jun., 1984.

High Heat From A Small Package by S. Oktay, R. R. Hanneman and A. Bar-Cohen Mechanical Engineering-Mar., 1986.

VLSI Packaging Technique Using Liquid-Cooled Channels by T. Kishimoto and T. Ohsaki-Electrical Communications Laboratories, Inc.-IEEE 1986.

Silicon Hybrid Wafer-Scale Package Technology by R. W. Johnson, J. L. Davidson R. C. Jeager and D. V. Kerns, Jr.-IEEE Journal of Solid-State Circuits, vol. SC-21, No. 5-Oct., 1986.

Multi-Chip Packaging Design for VLSI-Based Systems by C. J. Bartlett, J. M. Segelken and N. A. Teneketges-AT&T Bell Laboratories, New Jersey-IEEE 1987.

A Thermal Module Design for Advanced Packaging by L. T. Hwang, I. Turlik and A. Reisman-Journal of Electronic Materials, vol. 16, No. 5-1987 AIME 1987.

A High-Performance Thermal Module for Computer Packaging by D. Nayak, A L. T. Hwang, I. Turlik and A. Reisman-Journal of Electronic Materials, vol. 16, No. 5-1987-AIME 1987.

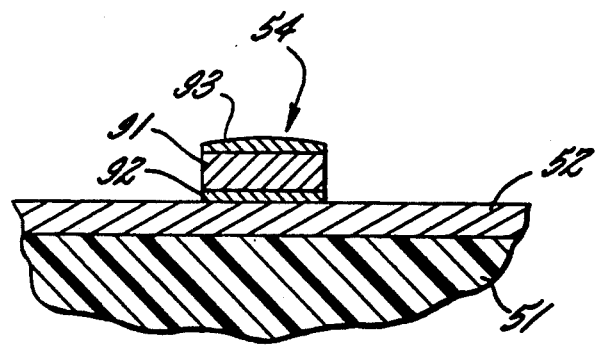
_Fig. 6A._
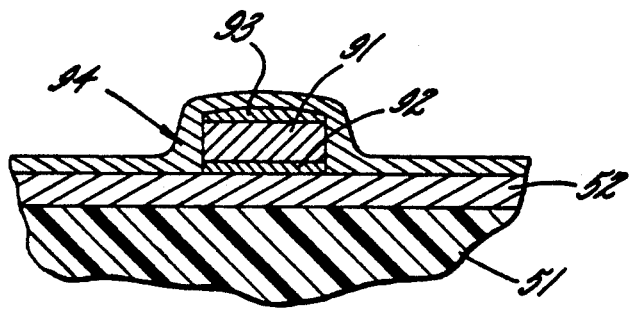
_Fig. 6B._
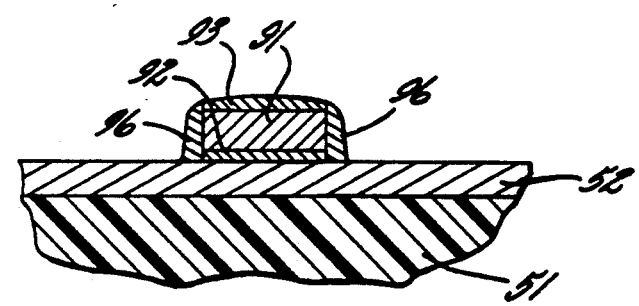
_Fig. 6C._
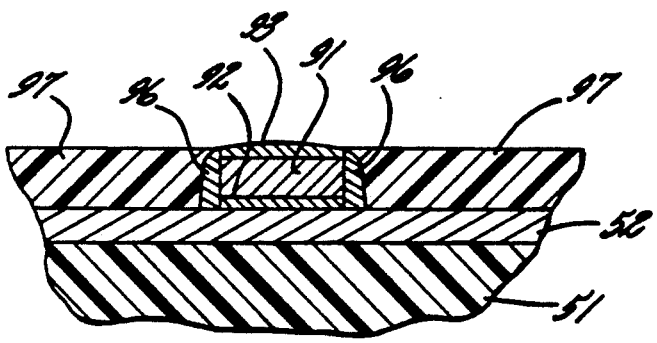
_Fig. 6D._

HIGH PERFORMANCE INTEGRATED CIRCUIT CHIP PACKAGE

This is a continuation of co-pending application Ser. No. 07/270,729 filed on Nov. 10, 1988 now abandoned.

FIELD OF THE INVENTION

This invention relates to thermal and electrical packaging of integrated circuit chips and more particularly to a thermal and electrical chip package which provides high density electrical interconnection and packaging for high speed, and high power dissipation for chip cooling, and methods of fabricating such high performance integrated circuit chip packages.

BACKGROUND OF THE INVENTION

A major hurdle in the production of high performance computers is the electrical and thermal packaging for very large scale integration (VLSI) and ultra large scale integration (ULSI) chips. While high performance VLSI and ULSI chips have been designed to include up to several million devices thereon, a major problem still exists in connecting these chips together and dissipating the heat produced. A high performance integrated circuit chip package must provide for high density electrical interconnection and thermal stability of integrated circuit chips.

It will be recognized that the electrical and thermal performance of integrated circuit packaging may represent conflicting design parameters. For example, an increase in package size may decrease the heat dissipation capability required per unit area. However such an increase in package size will increase the path length between chips and thereby increase the propagation delay. On the other hand, placing the chips closer together maximizes speed while requiring a large number of chip connections in a small area and high heat dissipation per unit area.

One well known high performance chip package is the Thermal Conduction Module (TCM), which is described in U.S. Pat. No. 3,993,123 to Hugh et al., and in an article entitled "Thermal Conduction Module: A High Performance Multilayer Ceramic Package," by A. J. Blodgett and D. R. Barbour published in the IBM Journal of Research and Development, Vol. 26, No. 1, P30 (January 1982). The TCM includes a multilayer ceramic substrate which is capable of providing connections for about 100 integrated circuit chips, each dissipating up to a maximum of 3-4 watts. The substrate, formed of fired alumina ceramic, includes up to 33 internal wiring layers therein, and about 1800 brazed input/output pins on the bottom surface thereof for connecting to the next level of packaging. Integrated circuits are mounted on the top surface of the substrate, using the well known controlled collapse chip connection ("C-4"), or solder bump technology. A cylindrical piston is spring biased against the back of each chip to provide a heat conductive path to a water cooled housing consisting of a cover or hat and a cold plate, the cold plate having suitable chambers for circulation of water. A metal C-ring is compressed between the hat and substrate frame to form a hermetic seal, and helium gas is provided in the hermetically sealed area for further heat conduction.

While the TCM represents a significant advance in multi-chip packaging, there are a number of limitations therein which make it unsuitable for high power high density VLSI and ULSI chips. For example, power dissipation is limited to about 3-4 watts per chip notwithstanding the elaborate cooling scheme. The multilayer ceramic substrate also possesses a number of shortcomings. First, the alumina substrate has a coefficient of thermal expansion which is quite different from that of the silicon integrated circuit chips, resulting in sufficient thermal mismatch such that the size of the chip is severely limited. Use of larger chips would result in stress-related reliability problems. The C-4 joints between the integrated circuits and the substrate provide a buffer between the thermal mismatch; however, the inflexibility of these joints provides a limit as to the size of integrated circuit chips which may be employed. Moreover, in order to properly align the 30 or more layers of the multilayer ceramic substrate, the conductive lines and vias internal to the substrate must be thick. A large number of layers must therefore be formed to provide all of the conductors necessary for chip connections. The large number of layers and the vias connecting them result in significant unwanted inductances and capacitances. The large number of layers also create potential yield problems. Since the entire substrate must be formed before it may be tested, a defect in any internal layer requires the entire substrate to be scrapped. Finally, the piston and spring arrangement for heat removal creates large mechanical stresses on the chips and requires a hermetically sealed helium environment for added heat dissipation. This scheme also severely limits the heat removal capability of the package.

The art has provided many improvements on the basic TCM in an attempt overcome these shortcomings. For example, U.S. Pat. No. 4,092,697 to Spaight describes a TCM in which a thermal liquid material enclosed in a film is mounted between the chips and heat sink. U.S. Pat. No. 4,639,829 to Ostergrin et al. discloses a truncated solid conical piston which includes a thin layer of high thermal conductivity grease between the piston and heat sink for added heat dissipation. U.S. Pat. No. 4,617,730 to Geldermans et al. discloses a method of forming a chip interposer which is placed between a multilayer ceramic substrate and an integrated circuit chip to provide thin film redistribution interconnections. Finally, an article entitled "High Performance Heat Sinking for VLSI" published by D. B. Tuckerman and R. F. W. Pease in the IEEE Electron Device Letters, Volume EDL-2, No. 5, May, 1981, at page 126, discloses a use of a large number of small fluid channels for cooling an integrated circuit chip. Notwithstanding these and other improvements, the TCM does not provide a dense enough or powerful enough package for VLSI and for future generations of ULSI chips.

SUMMARY OF THE INVENTION

It is therefore an object of the invention to provide an integrated circuit chip package which provides high density interconnection and high power dissipation for integrated circuit chips.

It is another object of the invention to provide an integrated circuit chip package the component parts of which are easy to fabricate using known techniques.

It is another object of the invention to provide an integrated circuit chip package in which thermal mismatches between the chips and the package are minimized.

It is another object of the invention to provide a chip package which conducts heat without the need for piston and spring arrangements.

It is yet another object of the invention to provide a chip package which may be tested during intermediate fabrication steps, and reworked if necessary.

These and other objects are provided by an integrated circuit chip package which employs three unique and interrelated elements for high performance thermal and electrical characteristics. The first element is a support substrate having conductors or connectors extending from one face to the opposite face thereof, and a multilayer wiring substrate on the opposite face of the support substrate for connecting the front face of integrated circuit chips mounted thereon to one another and to the conductors by C-4 like or other suitable attachment techniques. The second element is a heat sink having microchannels formed therein at one face thereof, while the third element is a thermally conductive cushion material connecting the one face of the heat sink with the exposed backside faces of the integrated circuit chips.

In particular, the support substrate is a monolithic block of fired ceramic, having a coefficient of thermal expansion which matches that of silicon, and having metal filled vias extending therethrough from one face to the opposite face thereof. In a preferred embodiment, the support substrate is aluminum nitride or silicon carbide with molybdenum filled vias. Input/output connectors, for example brazed pins or pads, are provided on the one face of the support substrate for connection to the next level of packaging. A multilayer wiring substrate on the opposite face of the support substrate includes a number of thin film insulating layers having conductive vias and a conductive plane therein. The thin film layers are formed on the support substrate one at a time using a self-aligned thin film process described below. Such thin films are formed by semiconductor-type chip fabrication processes. The integrated circuit chips are mounted on the exposed surface of the multilayer wiring substrate using C-4 solder bumps or other mounting means.

It will be noted by those having skill in the art that since the support substrate may be, in its simplest implementation, a single layer substrate, it may be fabricated of a material whose thermal coefficient of expansion more closely matches that of the silicon chips, rather than alumina as used in the TCM. Accordingly, minimal stress is placed on the C-4 solder bumps or balls, so that larger size integrated circuit chips may be used. Moreover, since all of the power, ground and signal planes are provided in a thin film multilayer wiring substrate, a dense interconnection pattern with reduced resistive, capacitive and inductive parasitics may be formed, compared with the TCM's thick film multilayer ceramic substrate. Since dense interconnection patterns may be formed, all power, ground and signal interconnections may be formed using about six layers, in contrast with thirty or more layers required in a multilayer ceramic substrate. Also, since the multilayer wiring substrate is built up on the support substrate one layer at a time, each layer may be tested after it is formed, and if defective, may be reworked prior to forming the next layer.

According to another aspect of the invention, the heat sink includes microchannels formed therein at one face thereof. This heat sink is also formed of material having a coefficient of thermal expansion which closely matches that of silicon; for example fired silicon carbide. Microchannels may be machined in the fired silicon carbide. Alternatively, the silicon carbide heat sink may be formed around organic microchannel rods which vaporize during the firing process leaving the silicon carbide heat sink with the microchannels formed therein. In another implementation, the microchannels may be molded using powdered silicon carbide or silicon carbide firing mixture. The microchannels are placed as close to the one face of the heat sink as possible, consistent with mechanical rigidity and stability. The microchannels provide a high degree of heat transfer compared with a single large channel or plenum interior to the heat sink. The structural and thermal considerations which influence the precise structural configuration of the channels within the heat sink structure have been described in "A Thermal Module Design for Advanced Packaging" by L. Hwang, I. Turlik and A. Reisman, J. Electronic Mat., Vol. 16, No. 347 (1987).

According to a further aspect of the invention, a soft, thermally conductive mechanical cushion material is used to connect the microchannel end of the heat sink to the exposed back faces of the chips. The thermally conductive mechanical cushion material is sufficiently thin to efficiently conduct heat from the integrated circuits to the microchannel area through the wall of the heat sink while being sufficiently thick and soft to provide a mechanical cushion against the dimensional and positional variations between the integrated circuits and the heat sink surface. In a preferred embodiment the heat sink is a low melting point metal, such as pure indium. The indium is placed between the chips and heat sink, and is reflowed to form a conformal layer therebetween. The indium mechanical cushion eliminates the TCM's complex system of pistons or fluid enclosed bags. Moreover, the indium, which can be thought of as solder in this application, together with the microchannel heat sink provides sufficient thermal conduction so that hermetic sealing and a helium atmosphere around the chips is not required (although it may be provided).

In the method of making the chip package according to the invention, the support substrate and the multilayer wiring substrate thereon are formed. The chips are mounted on the exposed face of the multilayer wiring substrate using well known C-4 solder bump or other suitable mounting technology. The heat sink and microchannels are formed and the microchannel face of the heat sink is placed adjacent to the exposed faces (back side surfaces) of the chips with a preform of the thermal cushion material therebetween. The entire assembly is then heated above the preform melting temperature, but below the melting point(s) of the C-4 solder connections, or any other component of the package, while maintaining a predetermined distance between the heat sink and the substrate with a support ring. The preforms melt and conform to the exposed faces of the integrated circuit chips and the face of the heat sink adjacent the microchannels.

According to another aspect of the invention, a method is described for forming a self-aligned thin film multilayer wiring substrate on a support substrate. Each layer of the multilayer wiring substrate includes conductive vias (for connecting one layer to another) and conductive planes (for power, ground, redistribution and signals) insulated from one another as appropriate. For each layer, the conductive vias are formed by forming holes in an insulating layer to uncover selected ones of underlying vias and/or conductive planes. Then, electroless plating is used to build up the conductive vias on the underlying vias or conductive planes. Conductive planes are formed in an insulator by etching the required pattern extending beyond selected ones of the underlyinq vias, using a photoresist and known lithographic techniques. A thin conductive film is evaporated on the patterned photoresist and insulator, and a well known "lift-off" technique is used to dissolve the photoresist and conductive film thereon, leaving the conductive film only on those areas which were previously etched in the required pattern. Electroless plating may be used to build up the conductor plane on the conductive film. The conductive vias may be solid conductors, for example copper or may be clad on the top, bottom and sides with a layer of chromium, nickel or an alloy thereof, for better adhesion or other purposes such as providing enhanced resistance to corrosion.

Since the method of forming the multilayer wiring substrate uses high density thin film techniques, all wiring may be accommodated in about six layers (compared with more than 30 layers for multilayer ceramic substrates). Moreover, electroless plating of conductors from underlying conductors provide self alignment of vias, enabling aggressive ground rules for via positioning, while lift-off and electroless plating provides self-aligned planes. Clad conductors provides better adhesion. Finally, since each layer is formed separately, the partly formed substrate may be tested, and reworked if necessary, before forming the next layer.

It will be recognized by those having skill in the art that the support substrate and multilayer wiring substrate of the invention may be employed in conjunction with other less efficient cooling techniques for integrated circuit packages; for example in conjunction with the spring loaded piston of the TCM. It will also be recognized by those having skill in the art that the microchannel heat sink and thermally conductive cushions of the invention may be employed in conjunction with other chip support substrates; for example multilayer ceramic substrates. However, it will also be recognized by those having skill in the art that the combination of the support substrate including the multilayer wiring substrate, the microchannel heat sink and the thermally conductive cushion material forms a unique integrated circuit package which provides for highly dense packaging with highly efficient heat transfer.

BRIEF DESCRIPTION OF THE DRAWINGS

FIGS. 6A-6D illustrate a method of forming clad metal vias or signal, power or ground planes in a multilayer wiring substrate according to the present invention.

DESCRIPTION OF THE PREFERRED EMBODIMENT

The present invention now will be described more fully hereinafter with reference to the accompanying drawings in which a preferred embodiment of the invention is shown. This invention may, however, be embodied in many different forms and should not be construed as limited to the embodiments set forth herein; rather Applicants provide this embodiment so that this disclosure will be thorough and complete, and will fully convey the scope of the invention for those skilled in the art.

Like characters refer to like elements throughout. For greater clarity, the thickness and relative thicknesses of the layers have been exaggerated, and the figures have not been drawn to scale.

Figure 1:
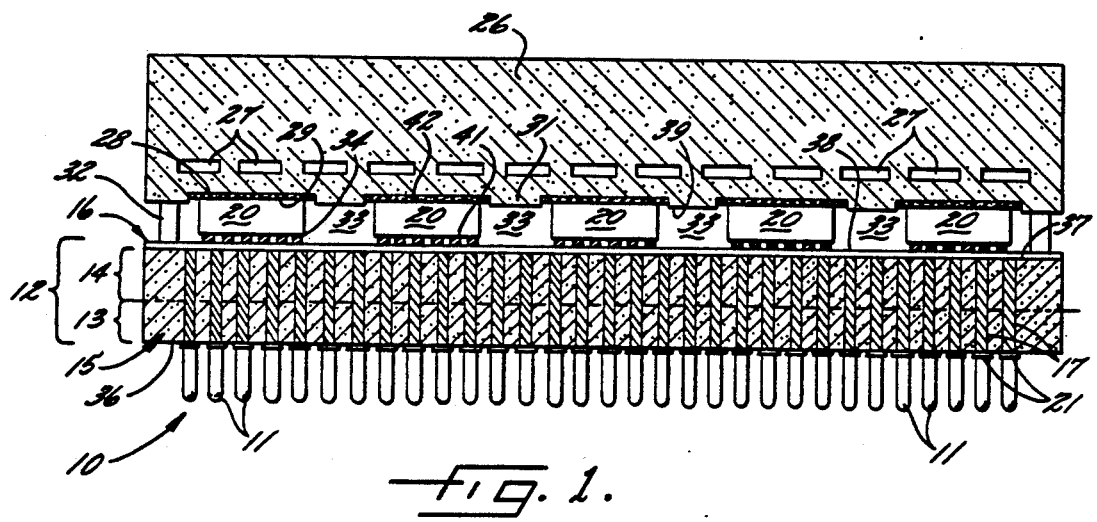
FIG. 1 is a schematic cross sectional view of the high performance integrated circuit chip package of the present invention.

Referring now to FIG. 1, there is shown an overall schematic cross sectional representation of the high performance integrated circuit chip package of the present invention. As shown in FIG. 1, integrated circuit chip package 10 comprises three major components: substrate 12 which itself comprises support substrate 15 and multilayer wiring substrate 16; heat sink 26 which includes a plurality of microchannels 27 therein; and cushions 28 formed of a thermally conductive low melting point, easily deformable cushioning material for transferring heat from chips 20 to heat sink 26. Each of these elements will now be described in detail.

Substrate 12 comprises support substrate 15 and multilayer wiring substrate 16. Support substrate 15 primarily provides support for multilayer wiring substrate 16, although it may also provide a significant degree of added heat dissipation capability because of its thermal conductivity. Support substrate 15 includes conductors 17 which extend from one face 36 to the opposite face 37 thereof. Support substrate 15 is formed of a material which has a coefficient of thermal expansion similar to that of silicon. In one embodiment, silicon carbide (SiC) is chosen because its coefficient of expansion $(3.7 \times 10^{-6}/°C.)$ closely matches that of silicon $(3.0-3.24 \times 10-C.)$. In addition, silicon carbide is a very good thermal conductor, having a thermal conductivity of 70-270 w/mk° compared with the alumina substrate used in the TCM which has a thermal conductivity of 20 w/mk°. Furthermore, silicon carbide is a mechanically strong material, having a Young's modulus of 410 GPa, compared with 190 GPa for silicon. In special applications, silicon itself or beryllium oxide may be used for support substrate 15. Since support substrate includes closely spaced conductors 17 therein, the dielectric constant of the substrate may be enhanced (at the expense of some thermal mismatch with silicon) by using aluminum nitride for support substrate 15. Aluminum nitride (AlN) has a coefficient of thermal expansion of $3.3-4.4 \times 10^{-6}/°C.$, a thermal conductivity of 230 w/mk° and a Young's modulus of 300-310 GPa. It has a dielectric constant of 9.3 compared with 20-30 for silicon carbide. Alternatively, other ceramic materials may be used.

Support substrate 15 may be formed as follows: a monolithic block of silicon carbide, silicon nitride, silicon or other material having a thermal coefficient of expansion which matches silicon is fired to provide a unified structure according to well known techniques. Then, holes are drilled from face 36 to face 37, using laser drilling or conventional mechanical drilling. Alternatively, a material may be formed in the shape of conductors 17, and a block of silicon carbide or silicon nitride may be pressed and formed around the material. Then, the structure is fired. During firing the conductor-shaped material may decompose and/or evaporate leaving channels, which are then filled with a conductor. Alternatively, the structure may be slip-formed from powder by techniques well known in the ceramic manufacturing art. Molybdenum is preferred for conductor 17 because its thermal coefficient most closely matches silicon carbide. Alternatively, tungsten or other metals or alloys may be used. The holes or channels may be filled with conductor by first coating the walls of the channels with Mo-Ni alloy using an electroless deposition process. The channels may then be filled with Cu-Ag alloy which is brazed into the channels. If necessary, the filled substrate may be fired again to solidify conductors 17.

A number of input/output connector pins 11 are attached to support substrate 15. The pins may be brazed to pads 21. Alternatively, pads 21 alone may be the input/output connector for surface mount technology. In a preferred embodiment, a pin grid array of 2590 pins may be formed with 2.5 mm between pin centers, on a 9 cm×9 cm substrate area. For an 11 cm×11 cm substrate, 3872 pins may be accommodated. As is well known to those having skill in the art, a high input/output count is a critical requirement for advanced packaging of VLSI/ULSI chips.

Referring again to FIG. 1, multilayer wiring substrate 16 is formed using a self-aligned planarized thin film process, the details of which are described below in connection with FIGS. 4, 5 and 6. The structure of multilayer wiring substrate 16 will be described below in connection with FIG. 3. Integrated circuit chips 20 are mounted on exposed surface 38 of multilayer wiring substrate 16 using controlled collapse chip connection (C-4) solder balls 34. As is well known to those having skill in the art, C-4 technology permits the total surface of the chip as opposed to only its edges to be used for input/output connections. Because there is an excellent thermal match between the chips and the substrate of the present invention, and there is a small chip temperature rise due to the excellent heat dissipation capabilities of the package, a large size chip (for example 2 cm on an edge or more), may be used. This compares with the 0.4–0.5 cm on an edge chips currently used in TCMs due to the thermal mismatch between the silicon chips and the alumina multilayer ceramic substrate. Moreover, the presence of a large number of C-4 joints also alleviates a heat dissipation problem to some extent, since heat is also removed through these joints, as described by A. Reisman et al "Heat Dissipation From Silicon Chips in a Vertical Plate Elevated Pressure Cold Wall System", J. Electronic Mat., Vol. 11, No. 391 (1982). It is indicated, for example, that heat conduction is enhanced by as much as 17% due to the presence of 121 C-4 contacts between the chip and an interconnection support substrate.

Heat sink 26 is preferably formed of a material having a thermal coefficient of expansion similar to that of silicon and close to that of the support substrate. As discussed in connection with support substrate 15, silicon carbide may be used, although silicon or other ceramic materials may also be used. Since the dielectric constant of heat sink 26 is irrelevant, SiC or AlN might be used. Microchannels 27 may be formed in heat sink 26 using laser or mechanical drilling or using an organic fill. Laser drilling will provide smoother microchannels which are more amenable to laminar fluid flow therethrough, while mechanical drilling or organic fill will provide rougher microchannels to thereby enhance turbulent flow. Microchannels 27 are formed as close to face 39 of heat sink 26 as is possible consistent with the mechanical rigidity necessary to prevent deformation or warpage of the microchannels. In a preferred embodiment, using turbulent fluid flow, channels which are about 1 mm deep, spaced 1 mm apart and having a width of about 5 mm are formed 1 mm below the surface. Such a configuration was deduced from the results of extensive analyses described in the publication by L. Hwang et al previously referenced. The heat sink 26 and substrate 12 may be 10.16 cm×10.16 cm (6"×6") and may carry up to 25 chips. The effective cooling area of the heat sink is 9 cm×9 cm. In one specific implementation, each chip is a 1 cm square and is spaced 0.8 cm apart from the other chips In such a module it has been found that 1000 watts (40 watts/chip) may be dissipated with a maximum temperature rise on a chip of only 12° C. with respect to the temperature of the input water. For the worst power case, where all chips except the one at the inlet end are powered to 40 watts per chip, the maximum variation of temperature between chips is also less than 12° C. These results will allow use of 25 VLSI/ULSI chips in the package. It is recognized that since such power dissipation demands are rare, the actual chip temperature rise will be much less. This worst case number, 12° C., is to be compared with conventional cooling designs which allow for 60° C. or greater temperature rises above ambient temperature conditions. Such temperature excursions may affect chip reliability and always result in performance degradation since circuit designs must take worst case temperature excursions into account.

Cushions 28 will now be described. Cushions 28 provide a thermally conductive path between the exposed back faces 42 of chips 20 and heat sink 26; and provide a cushion which accommodates aspirates, tolerances and thermal expansions between chips 20 and heat sink 26. In particular, it is well known that when C-4 solder balls 34 are employed, chips 20 will have a considerable variation in parallelism and in depth. It is also known that thermal expansion may cause the distance between chips 20 and heat sink 26 vary. Accordingly, cushion 28 must be sufficiently thick to be able to absorb movement between chips 20 and heat sink 29 during thermal cycling, yet sufficiently thin to act as a good thermal conductor between chips 20 and heat sink 26.

The preferred material for cushion 28 is a low melting point ductile material of high heat conductivity. This material may be thought of as a solder. One preferred solder is pure indium (melting point 156.6° C.). Indium is a preferred solder because it has the highest thermal conductivity (0.8° C./W/cm$^2$) of the low melting point elemental materials which can serve as solders (including Pb, Sn, Bi, Ga, Cd and As), and undergoes creep deformation (is very ductile) at very low stresses. Also, pure indium is preferred because small additives of other materials (i.e. alloys of indium) can be used to decrease the creep rate for a given applied stress relative to pure (99.999%) indium thereby reducing compliance.

Figure 2A:
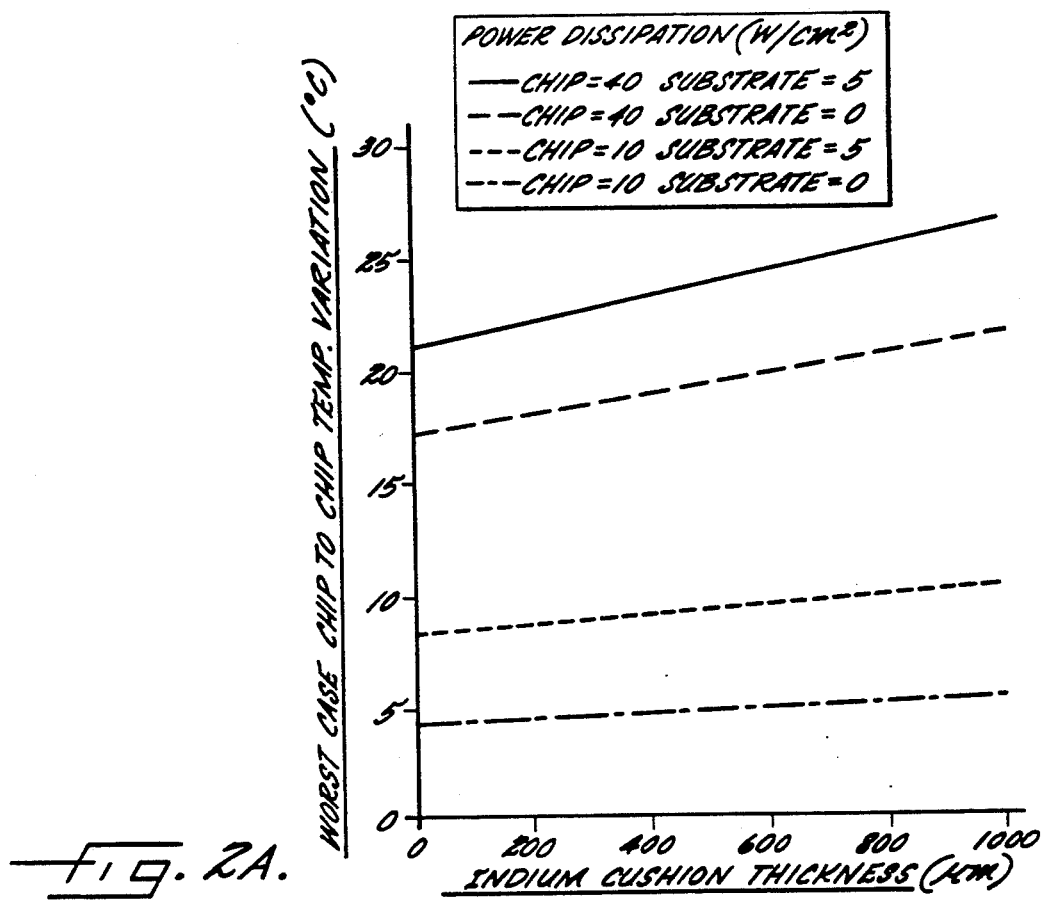
FIGS. 2A and 2B are graphs describing the variation in temperature and shear strain for various thickness of indium cushion.
Figure 2B:
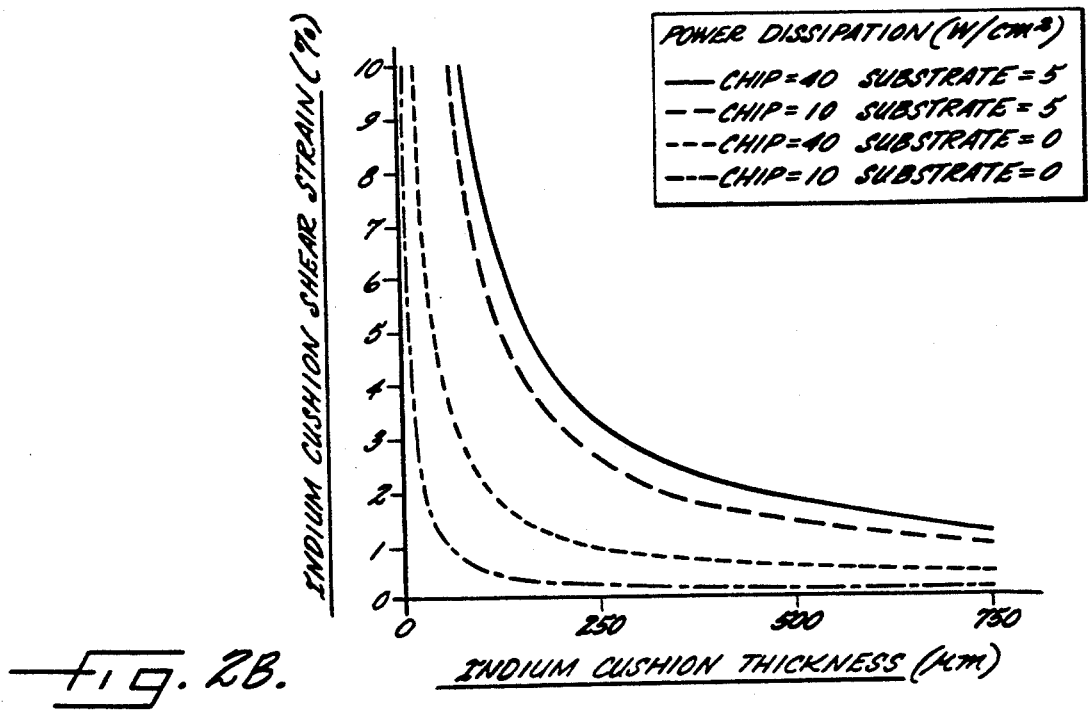

Referring now to FIG. 2, the worst case chip to chip temperature variation (FIG. 2A) and worst case indium shear strain (FIG. 2B) for various thickness of indium will be described in order to illustrate how the thickness of indium cushion 28 may be chosen. For purposes of obtaining the specific data depicted in FIG. 2, a package design having a 5×5 array of 1 cm×1 cm chips 20 on a 1.8 cm pitch were employed. It was assumed that chips 20 were reflow bonded to substrate 12 with 95Pb5Sn C-4 connectors 34, each such connector having a 125 um nominal diameter and a nominal height of 75 um on a 250 um pitch. Each chip 20 has a 37×37 C-4 connector array for a total of 1357 connections (3 connectors removed from each corner). Substrate 15 was assumed to be a 4 in.×4 in. AlN substrate with post fired molybdenum conductors 17. Multilayer wiring substrate 16 was assumed to consist of a copper ground plane and 2-6 signal and reference planes in a polymeric dielectric. Electroless nickel vias may be employed. Heat sink 26 was assumed to be densified reaction-sintered silicon carbide with 10% silicon. There were assumed to be 15, 1 mm×5 mm water channels 27, with a total flow rate of 550 cc/s through heat sink 26.

To account for wide variability in the possible power dissipation exhibited by the 25 chips in the package, four cases were considered in FIG. 2; i.e. power dissipation of 10 and 40 w/cm$^2$ in chips 20 and 0 and 5 w/cm$^2$ in multilayer wiring substrate 16. Referring now to FIG. 2A, the worst case chip to chip temperature variation is shown for various thicknesses of indium cushion. It will be seen that due to the high thermal conductivity of indium, increasing indium thickness only has a small influence on worst case chip to chip variation. Referring now to FIG. 2B, indium shear strain is shown for various thicknesses of indium cushion. It will be seen that because of indium's high ductility it requires about 500 μm thickness before shear strain becomes small and therefore insensitive to further cushion thickness. Thus, if minimal distortion is desired, a 500 μm minimum thickness cushion will provide near minimum shear strain consistent with small chip to chip temperature variations. Since the chip to chip height variations due to C-4 height variations across package 10 may introduce up to a ±145 μm variation in cushion thickness, a nominal thickness of 650 μm cushion should be provided. For other package designs graphs similar to FIG. 2A and 2B may be designed, empirically or by simulation techniques, and the optimum thickness of cushion 28 may be chosen. As was described above, cushion 28 is chosen to be sufficiently thick to cushion the variation of thermal mismatches between chips 20 and sink 26 while providing effective thermal coupling between chips 20 and heat sink 26.

Referring again to FIG. 1, a support ring 32 is used to determine the nominal cushion thickness, upon indium reflow. A support ring thickness of 1250 μm is specified to produce desired indium thickness of 500 μm. The support ring should be of a rigid material to protect the assembly package from any mechanical stresses during handling. A hermetic seal may be provided between substrate 12 and heat sink 26 for protecting integrated circuits 20 and solder ball connections 34 and for providing additional cooling using helium or other high conductivity ambient atmosphere in spaces 33 if necessary. It will also be seen that support substrate 15 may be formed of pin support substrate 13 and wiring support substrate 14. Substrates 13 and 14 may be formed as was described with respect to support substrate 15. Two substrates (13 and 14) may be employed so that brazing of pins 11 may be performed on one substrate (13) and thin film multiwire substrate 16 may be formed on another substrate (14) in separate operations. Then, both substrates may be combined using brazing or other well known techniques.

Figure 3:
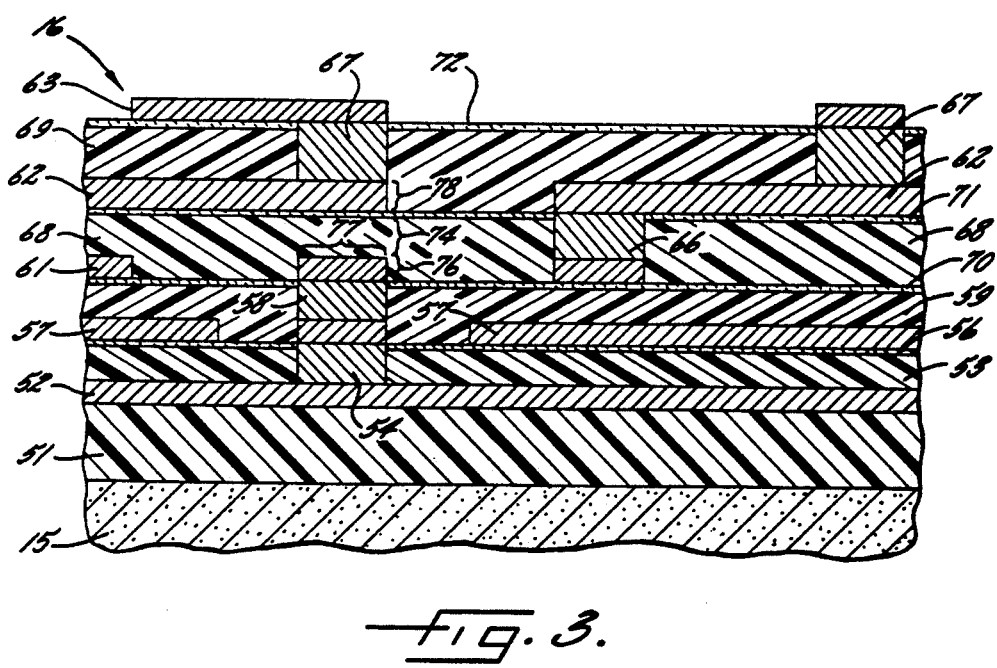
FIG. 3 is a schematic cross-sectional view of the multilayer wiring substrate of FIG. 1.

Referring now to FIG. 3, multilayer wiring substrate 16 will be described. Substrate 16 is formed on support substrate 15, and includes a first insulating layer 51 and a conductive power plane 52 formed thereon. A conductive via for connecting power plane 52 with one conductor 17 in support substrate 15 is not shown. Second insulating layer 53 includes a plurality of metal filled vias 54 therein. Optional silicon dioxide insulating layer 56 may be formed on insulating layer 53. Ground plane 57 is formed on first insulating layer 53 (or on optional layer 56). A second via layer 58 and a third insulating layer 59 are also included. Similarly, a Y signal plane 61 an X signal plane 62 and top surface metallurgy 63 is included with via layers 58, 66 and 67 and dielectric layers 59, 68 and 69 and optional silicon dioxide layers 70, 71 and 72, respectively, therebetween. Top surface metallurgy 63 connects multilayer wiring substrate 16 to solder balls 34.

As may be seen from FIG. 3, all of the interconnection wiring among chips 20 and between chips 20 and pins 11 may be provided using only four layers of thin film wiring, i.e. ground plane 57, power plane 52, Y signal plane 61, and X signal plane 62. This is as a result of using thin film self-aligned processes to form multilayer wiring substrate 16, and contrasts sharply with the TCM's thick film multilayer ceramic substrate process in which 30 or more layers are required for power, ground, redistribution, X and Y signal planes. For the embodiment described herein, the distance 74 between a wiring plane and a via is about 6 um while the thickness 76 of a via layer or wiring plane is about 4 um, and the width 77 of a via is about 14 um.

Referring now to FIGS. 4A-4E, a self-aligned method of forming a layer of filled vias (for example vias 54, 58, 66 or 67 in FIG. 3) according to the invention, will be shown. It will be recognized by those having skill in the art that this process may be repeated to form the requisite number of via layers.

Figure 4A:
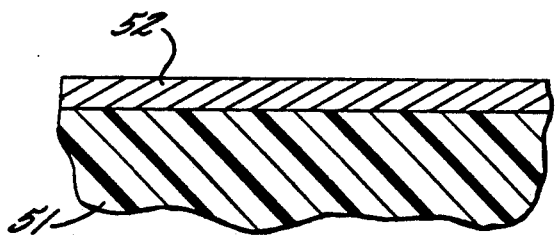
FIGS. 4A-4E illustrate a method of forming self-aligned vias in a multilayer wiring substrate according to the present invention.
Figure 4B:
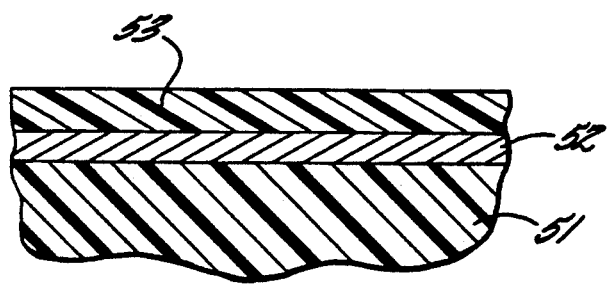
Figure 4C:
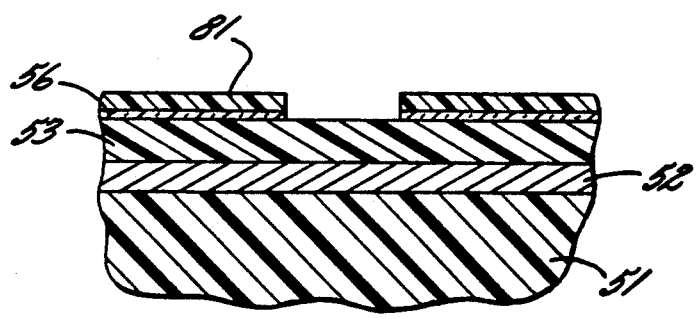

Referring now to FIG. 4A, insulating layer 51, comprising polyimide, for example DuPont PI2525 polyimide, Hitachi PIQ13 polyimide or Dow Chemical's Bis (benzocyclobutene) based material (Product code HXU13005.02L), 4-10 μm thick, is deposited on an underlying layer (for example support substrate 15) using conventional spin deposition and is fully cured by heating through a range of temperatures to 400° C. It should be noted that all the insulating layers in multilayer wiring substrate 16 may be formed as above. Then, power plane 52 is deposited by evaporating, sputtering, CVD or any other suitable method, a layer of copper, or layers of chromium, copper and chromium for a total thickness of 4 μm. referring now to FIG. 4B, insulating layer 53 is spun on and cured at 250° C. Referring to FIG. 4C, a 1 μm layer 56 of optional silicon dioxide or other suitable material such as silicon nitride is deposited on insulating layer 53 by Plasma Enhanced Chemical Vapor Deposition (PECVD) at 300° C., and layer 81 of photoresist 4 μm thick is deposited thereon. Photoresist 81 is then patterned. The patterned photoresist 81 and underlying optional insulating layer 56 are etched with layer 53 acting as an etch stop. PECVD SiO$_2$ may be etched in SF$_6$ at a rate of 10 μm/min.

Figure 4D:
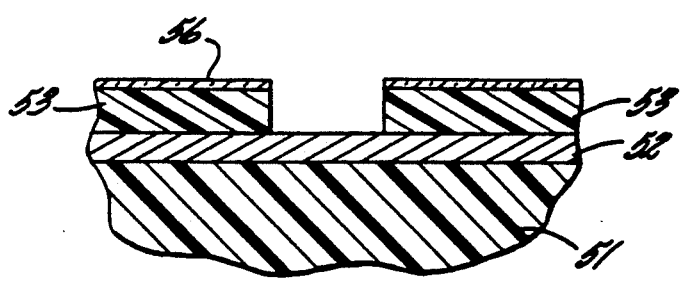

Referring now to FIG. 4D, a reactive ion etch is performed on insulating layer 53 using an etch of 10 sccm O$_2$ and 50 sccm N$_2$ at 2 KW, which yields a selectivity relative to the photoresist greater than 10 to 1, i.e.

the insulating layer 53 etches 10 times faster than its overlying photoresist layer. While conventional reactive ion etching techniques may be employed, a preferred reactive ion etching may employ a split magnetron system at 1-2 $\mu$m/min. Such a split magnetron system is more fully described in U.S. Pat. No. 4,738,761 to Bobbio et al. Optional layer 56 may be left on or removed.

Figure 4E:
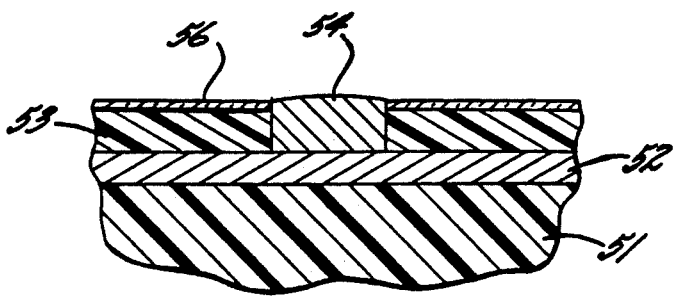

Referring now to FIG. 4E, a self-aligned conducting via 54 is formed by first etching the top most chromium layer in power plane 52 (if present) using an etch of 1:1 $H_2O$/HCL etch solution. Then, the surface to be plated is activated using a $PdCl_2$ solution, and an electroless plating of 8 $\mu$m nickel is performed. Electroless plating prevents copper from forming on insulating areas 53 and will only allow nickel to form on the exposed palladium sensitized portion underlying power plane 52.

Figure 5A:
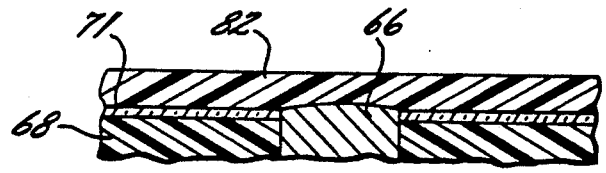
FIGS. 5A-5E illustrate a method of forming self-aligned conductor planes in a multilayer wiring substrate according to the present invention.

Referring now to FIGS. 5A–5E, the method of forming conductor wiring planes (for example power plane 52, ground plane 57, Y signal plane 61 or X signal plane 62) will be shown. One preferred technique uses a lift-off process. The process will be illustrated for X signal plane 62 which lies on via 66. Referring to FIG. 5A, a 4 $\mu$m insulating layer 69 is spun and cured at 250° C.

Figure 5B:
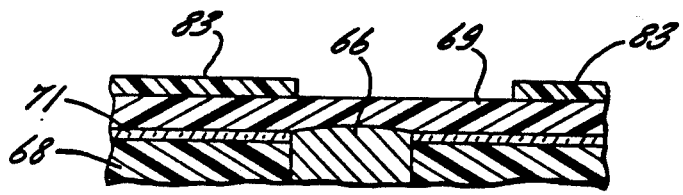
Figure 5C:
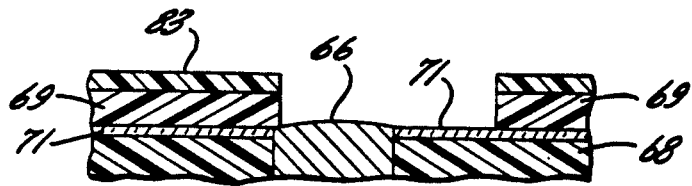
Figure 5D:
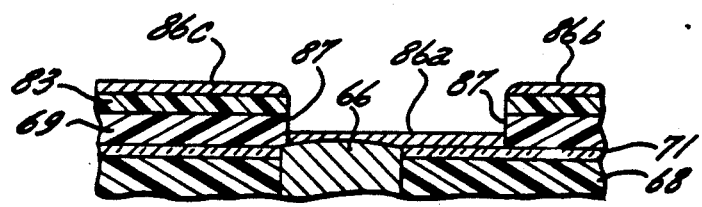
Figure 5E:
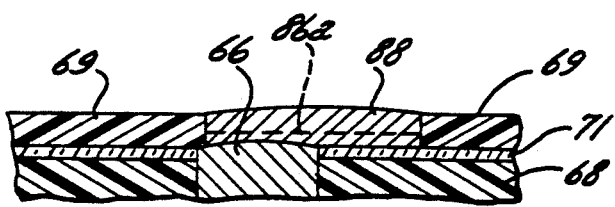

Referring to FIG. 5B, a 4 $\mu$m layer 83 of photoresist is spun, cured and patterned using well known techniques. Then, (FIG. 5C) a reactive ion etch is performed into insulating layer 69 as was described with respect to FIG. 4D. As illustrated in FIG. 5C, the etch uncovers an area extending beyond via 66. $SiO_2$ layer 71 acts as an etch stop. Then, (FIG. 5D) a 0.01 $\mu$m layer of palladium 86 is evaporated. As will be seen in FIG. 5D, layer 86 deposits on planer regions 86a, b and c, but not on sides 87 because of the retrograde profile of the composite insulator-photoresist structure. Then the photoresist is dissolved, lifting off the evaporated palladium (86b and c) in the process, according to a well known lift-off process. After the lift-off patterning has been effected, only layer 86a remains. Then (FIG. 5E) electroless plating of nickel 88 takes place using palladium 86a as an activator. Accordingly, self alignment of the dielectric area is obtained by using the palladium activated lift off process.

It will be understood by those having skill in the art that the process described above provides for self alignment of vias and conductor patterns. It will also be understood by those having skill in the art that high density is provided by using thin film processes. It will also be understood that after each self-aligned layer is formed, it may be tested prior to forming the next layer. If a layer is defective it may be etched away, or the entire partially formed multilayer wiring substrate may be removed down to support substrate 15, and the process may be restarted. This contrasts with the known multilayer ceramic substrate in which 30 or more layers must be formed and then fired before the substrate may be tested. While FIGS. 4A-4E and 5A-5E describe a preferred self-aligned thin film process, it will be recognized by those having skill in the art that other processes, including those for forming multilevel chip metallization layers, may be employed.

Referring now to FIGS. 6A-6D, an alternate method of forming a via, for example via 54 of FIG. 4E, will be described. It has been found that the better conducting film thin metals suffer from poor adhesion to commonly used dielectric materials, for example polyimide. Gold, for example, adheres poorly to polyimide, while copper tends to oxidize during polyamic acid conversion to polyimide, resulting in the failure of adhesion at the copper oxide polyimide interface. In order to overcome the problems of poor adhesion, it is known to clad the upper and lower surface of a thin film conductor with a metal from the class of metals which form metalocenes, for example nickel and chromium. However, the cladding of a nickel or chromium layer above and below a copper or gold thin film conductor does not prevent separation of the conductor from the sidewall, which is known to occur. According to the present invention, a method of cladding the sidewall of a thin film conductor is provided, to form a completely clad conductor; i.e. a conductor clad on the top, bottom and side.

Referring now to FIG. 6A, there is shown a portion of power plane 52, near first via 54, the fabrication of which was described in FIG. 4e. As was shown in FIG. 4E, first via 54 lies on power plane 52 which in turn lies on first insulating layer 51. As shown in FIG. 6A, first via 54 may include intermediate copper layer 91, bottom cladding layer 92, typically chromium, nickel or alloys thereof, and top cladding layer 93 typically chromium, nickel or alloys thereof. Second insulating layer 53, shown in FIG. 4E, has been removed.

Referring now to FIG. 6B, cladding layer 94 comprising chromium, nickel or an alloy thereof or other suitable metal or alloy is sputtered onto power plane 52. The sputtering, because of the pressure at which it is conducted, results in conformal coating. Then (FIG. 6C), an anisotropic etch, for example ion mill or reactive ion etching, is employed to remove the horizontal portions of cladding layer 94 leaving only sidewall cladding portion 96 thereon. Insulating layer 97 is then coated onto the structure as shown in FIG. 6D. As may be seen in FIG. 6D, conductor 91 now includes upper cladding layer 93, lower cladding layer 92 and side cladding layer 96 thereby resulting in a completely clad conductor with superior adhesion characteristics.

It will be understood by those having skill in the art that other metals may be used for cladding layers 92, 93 and 96 and that an electroplating rather than a sputtering technique may be used to deposit cladding layer 94 in FIG. 6B. The etchant gases for the reactive ion etching step depend on the metallurgy employed. For example, for chromium, $CF_4$ is employed while for NiCr, $Cl_2$ is employed.

Referring once again to FIG. 1, the method for forming package 10 according to the invention will now be described. In forming this package, it is critical that stress absorbing cushions 28 have the lowest melting point or deformation temperature of all components used. According to the method, substrate 15 and multilayer wiring substrate 16 are formed as was described above. Pins 11 may be brazed to substrate 15 before or after multilayer wiring substrate 16 is formed. Alternatively, as described above, pins may be brazed to pin support substrate 13 and multilayer wiring substrate 16 may be formed on wiring support substrate 14 and then substrates 13 and 14 may be joined. Chips 20 are then mounted on multilayer wiring substrate 16 using C-4 solder connections (bumps) 34. It should be noted that the melting point of C-4 solder connections (bumps) 34 must be higher than the melting point of cushions 28 so that the solder balls do not remelt when the cushions are formed.

Heat sink 26 having microchannels 27 therein is formed and substrate 12 having integrated circuits thereon and heat sink 26 are brought together. A solder preform may be used for cushions 28, with the preforms held in place using grooves 31 cavities 28 or a combination thereof. Alternatively, a single preform may be used across the entire width of heat sink 26. Once brought together, the entire assembly is heated above the melting temperature of cushion 28, with the distance between substrate 12 and heat sink 26 being maintained by the support ring 32 at a predetermined thickness. Cushions 28 melt and reflow to form a conformal cushion between heat sink 26 and integrated circuits 20, accommodating separation irregularities between the chips and their underlying substrate in the process. The assembly is then allowed to cool.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit chip package comprising:
    a support substrate having conductors extending from one face to the opposite face thereof, and a multilayer wiring substrate on said opposite face;
    a plurality of integrated circuit chips, each having a front face and a back face;
    means for rigidly mounting the front faces of said integrated circuit chips on said multilayer wiring substrate, opposite said support substrate and for electrically connecting the front faces of said integrated circuit chips to said multilayer wiring substrate, such that said integrated circuit chips are electrically connected to one another and to said conductors;
    a heat sink having microchannels formed therein, said microchannels being adapted for transporting cooling fluid therein, said heat sink being rigidly mounted on said support substrate such that a face of said heat sink is disposed adjacent, and a predetermined fixed distance from, the back face of said integrated circuit chips mounted on said multilayer wiring substrate; and
    a plurality of thermally conductive cushion layers, a respective one of which extends from said face of said heat sink to said back face of a respective one of said integrated circuit chips, for conducting heat from said integrated circuit chips to said heat sink and for absorbing dimensional variations between the back faces of said integrated circuit chips and said heat sink face during thermal cycling, which results from rigidly mounting said front faces of said integrated circuit chips on said multilayer wiring substrate, and rigidly mounting said heat sink on said support substrate.

2. The integrated circuit chip package of claim 1 further comprising input/output connectors, electrically connected to respective conductors on said one face of said support substrate, for providing electrical connection to a next level of packaging.

3. The integrated circuit chip package of claim 2 wherein said input/output connectors comprise metal pins which are electrically connected to respective conductors.

4. The integrated circuit chip package of claim 2 wherein said input/output connectors comprise metal pads which are electrically connected to respective conductors.

5. The integrated circuit chip package of claim 1 wherein said integrated circuit chips are formed of silicon semiconductor material, and wherein said support substrate and said heat sink are formed of materials having a coefficient of thermal expansion which closely matches that of silicon.

6. The integrated circuit chip package of claim 5 wherein said support substrate and said heat sink are formed of silicon carbide.

7. The integrated circuit chip package of claim 5 wherein said support, substrate and said heat sink are formed of silicon.

8. The integrated circuit chip package of claim 5 wherein said support substrate is formed of aluminum nitride or silicon carbide and said heat sink is formed of aluminum nitride or silicon carbide.

9. The integrated circuit chip package of claim 1 wherein said multilayer wiring substrate comprises a plurality of insulating layers having conductive vias and conductive planes therein.

10. The integrated circuit chip package of claim 9 wherein said conductive vias comprise a first conductor and a second conductor on the sides thereof.

11. The integrated circuit chip package of claim 9 wherein said conductive planes comprise a a power plane, a ground plane, an X signal plane and a Y signal plane.

12. The integrated circuit chip package of claim 1 wherein said rigidly mounting means comprises a plurality of solder bumps for rigidly mounting said integrated circuit chips on said multilayer wiring substrate.

13. The integrated circuit chip package of claim 1 wherein said integrated circuit chips are about 1 cm square, and said microchannels are 1 mm deep, spaced 1 mm apart, having a width of 5 mm each and are located 1 mm below said face of said heat sink.

14. The integrated circuit chip package of claim 1 wherein each of said thermally conductive cushion layers is a layer of reflowed solder.

15. The integrated circuit chip package of claim 14 wherein said reflowed solder is a soft, low melting point solder.

16. The integrated circuit chip package of claim 14 wherein said solder is indium.

17. The integrated circuit chip package of claim 16 wherein said indium is about 650 $\mu$m thick.

18. The integrated circuit chip package of claim 14 wherein said solder is an alloy of indium.

19. The integrated circuit chip package of claim 1 wherein said thermally conductive cushion layers comprise solder preforms and wherein said heat sink includes a plurality of cavities at said one end for holding said preforms.

20. The integrated circuit chip package of claim 1 wherein said thermally conductive cushion layers are sufficiently thin to efficiently conduct heat from said integrated circuit chips to said heat sink, but sufficiently thick to cushion against dimensional variations and thermal expansions in said package.

21. The integrated circuit chip package of claim 1 wherein said support substrate comprises a pin support substrate and a wiring support substrate.

22. The integrated circuit chip package of claim 1 wherein said support substrate is a monolithic piece of insulating material having said plurality of conductors extending from said one face to said opposite face thereof.

23. An integrated circuit chip package comprising:
    a plurality of integrated circuit chips, each having a front face and a back face;

a first ceramic block having conductors extending therethrough from one face to the opposite face thereof, said first ceramic block being free of power, ground and signal panes therein;

input/output connectors, electrically connected to respective conductors on said one face of said first ceramic block, for providing electrical connection to a next level of packaging;

a multilayer wiring substrate on said opposite face of said first ceramic block, said multilayer wiring substrate comprising a plurality of insulating layers having conductive vias and conductive power, ground and signal planes therein, for providing power, ground and signal connections from said conductors;

controller collapse chip connections for rigidly mounting the front face of said integrated circuit chips on said multilayer wiring substrate;

a second ceramic block having microchannels formed therein at one face thereof for transporting cooling fluid therein, said second ceramic block being rigidly mounted on said first ceramic block such that said one face is disposed adjacent, and a predetermined fixed distance from, said back faces of said integrated circuit chips mounted on said multilayer wiring substrate; and a plurality of layers of indium or an alloy thereof, a respective one of which extends between a respective one of said back faces of said integrated circuit chips and said one face of said second block of ceramic, each layer of indium or an alloy thereof being sufficiently thin to efficiently conduct heat from said chips to said second block but sufficiently thick to absorb dimensional variations and thermal expansions in said package which result from the rigid mounting of said controlled collapse chip connections between said integrated circuit chips and said multilayer wiring substrate and from rigidly mounting said second ceramic block on said first ceramic block.

24. The integrated circuit chip package of claim 23 wherein said input/output connectors are metal pins which are electrically connected to respective conductors.

25. The integrated circuit chip package of claim 23 wherein said first and second ceramic blocks are silicon carbide.

26. The integrated circuit chip package of claim 23 wherein said first ceramic block is aluminum nitride and said second ceramic block is silicon carbide.

27. The integrated circuit chip package of claim 23 wherein said conductive vias comprise a first conductor and a second conductor on the sides thereof.

28. The integrated circuit chip package of claim 23 wherein said integrated circuits are about 1 cm square, and said microchannels are 1 mm deep, spaced 1 mm apart, having a width of 5 mm each, and are located 1 mm below said one face of said second ceramic block.

29. The integrated circuit chip package of claim 23 wherein said indium is about 650 $\mu$m thick.

* * * * *